United States Patent
Popiolkowski et al.

(10) Patent No.: US 6,933,508 B2
(45) Date of Patent: Aug. 23, 2005

(54) METHOD OF SURFACE TEXTURIZING

(75) Inventors: Alan R. Popiolkowski, Los Banos, CA (US); Shannon M. Hart, Campbell, CA (US); Marc O. Schweitzer, San Jose, CA (US); Alan B. Liu, Mountain View, CA (US); Jennifer L. Watia, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 362 days.

(21) Appl. No.: 10/099,307

(22) Filed: Mar. 13, 2002

(65) Prior Publication Data

US 2003/0173526 A1 Sep. 18, 2003

(51) Int. Cl.[7] ............................................... B23K 15/08
(52) U.S. Cl. ............................... 250/492.1; 219/121.18
(58) Field of Search ................... 250/492.1; 219/121.12, 219/121.29, 121.6

(56) References Cited

U.S. PATENT DOCUMENTS

| | | | |
|---|---|---|---|
| 3,514,391 A | 5/1970 | Hablanian et al. ........... 204/298 |
| 4,724,060 A | 2/1988 | Sakata et al. ................ 204/298 |
| 5,064,698 A | 11/1991 | Courtright et al. .......... 428/35.4 |
| 5,135,629 A | 8/1992 | Sawada et al. ........ 204/192.12 |
| 5,151,571 A | 9/1992 | Sanderson et al. |
| 5,209,813 A | 5/1993 | Oshida et al. |
| 5,459,297 A | * 10/1995 | Boppel et al. .......... 219/121.25 |
| 5,614,071 A | 3/1997 | Mahvan et al. ......... 204/298.11 |
| 5,632,869 A | 5/1997 | Hurwitt et al. ........ 204/192.12 |
| 5,656,093 A | 8/1997 | Burkhart et al. ............ 118/728 |
| 5,711,813 A | 1/1998 | Kadoiwa et al. ...... 118/723 VE |
| 5,804,046 A | 9/1998 | Sawada et al. ........ 204/298.11 |
| 5,830,330 A | 11/1998 | Lantsman .............. 204/192.12 |
| 5,837,057 A | 11/1998 | Koyama et al. ...... 118/723 VE |
| 5,838,016 A | * 11/1998 | Johnson .................. 250/504 R |
| 6,162,297 A | 12/2000 | Mintz et al. ................. 118/715 |
| 6,288,406 B1 | 9/2001 | Penberth et al. |
| 6,319,419 B1 | 11/2001 | Ohhashi et al. |
| 6,506,254 B1 | 1/2003 | Bosch et al. |
| 2002/0006766 A1 | * 1/2002 | Haerle et al. |
| 2003/0006217 A1 | 1/2003 | Dance |
| 2003/0047464 A1 | 3/2003 | Sun et al. |

FOREIGN PATENT DOCUMENTS

| | | |
|---|---|---|
| EP | 0 167 360 | 1/1986 |
| WO | WO 98/31845 A1 | 7/1998 |
| WO | WO 01/40540 A1 | 6/2001 |
| WO | WO 02/094497 A3 | 11/2002 |
| WO | WO 02/094497 A2 | 11/2002 |

OTHER PUBLICATIONS

Dance EP Pub. No. 0626228 A1, Nov. 1994.*
PCT International Search Report for File Reference No. APPM/6162PCT; International Appl. No. PCT/US 03/05781, International Filing Date Feb. 24, 2003 (4 sheets).

* cited by examiner

Primary Examiner—John R. Lee
Assistant Examiner—James J. Leybourne
(74) Attorney, Agent, or Firm—Moser, Patterson & Sheridan

(57) ABSTRACT

A method and system for providing a texture to a surface of a workpiece is provided. The method comprises providing a workpiece to a texturizing chamber and scanning a beam of electromagnetic energy across the surface of the workpiece to form a plurality of features thereon. The features formed are generally depressions, protuberances, and combinations thereof. Also provided is a method of reducing contamination in a process chamber. The method comprises scanning a beam of electromagnetic energy across a surface of one or more process chamber components to form a plurality of features thereon, positioning the one or more chamber components into a process chamber, and initiating a process sequence within the process chamber.

74 Claims, 9 Drawing Sheets

METHOD OF SURFACE TEXTURIZING

BACKGROUND OF THE INVENTION

1. Field of the Invention

Embodiments of the present invention generally relate to using a beam of electromagnetic radiation to modify the surface of a material. More particularly, embodiments of the present invention relate to a method of using an electron beam to modify the surface of components used in a process chamber.

2. Description of the Related Art

As integrated circuit devices continue to be fabricated with reduced dimensions, the manufacture of these devices become more susceptible to reduced yields due to contamination. Consequently, fabricating integrated circuit devices, particularly those having smaller physical sizes, requires that contamination be controlled to a greater extent than previously considered to be necessary.

Contamination of integrated circuit devices may arise from sources such as undesirable stray particles impinging on a substrate during thin film deposition, etching or other semiconductor fabrication processes. In general, the manufacturing of the integrated circuit devices includes the use of such chambers as physical vapor deposition (PVD) and sputtering chambers, chemical vapor deposition (CVD) chambers, plasma etching chambers, etc. During the course of deposition and etch processes, materials often condense from the gas phase onto various internal surfaces in the chamber to form solid masses that reside on these surfaces of the chamber. This condensed foreign matter accumulates on the internal surfaces of the chamber and is prone to detaching or flaking off from the internal surfaces in between or during a wafer process sequence. This detached foreign matter may then impinge upon and contaminate the wafer substrate and devices thereon. Contaminated devices frequently must be discarded, thereby decreasing the manufacturing yield of the process.

In order to prevent detachment of foreign matter that has condensed on internal surfaces of the process chamber, internal surfaces may be textured such that the condensed foreign matter that forms on these surfaces has enhanced adhesion to the surface and is less likely to detach and contaminate a wafer substrate. Methods currently used to texture chamber surfaces include "bead blasting." Bead blasting includes spraying hard particles onto the surface in order to affect a roughening of the surface. Alternatively, the surface may be texturized by applying a coating, such as a thin coating of aluminum deposited by an aluminum arc spray, to the surface. However, these and other commonly used methods for modifying the surfaces within a process chamber are sometimes ineffective at creating sufficient adhesion between the condensed masses and the chamber surface.

In order to circumvent the problems associated with detached foreign matter, chamber surfaces require frequent, and sometimes lengthy cleaning steps to remove condensed masses from the chamber surfaces. Also, despite the amount of cleaning that is performed, in some instances, contamination from detached foreign matter may still occur.

Therefore, there is a need to reduce contamination from foreign matter that has condensed on interior surfaces of a process chamber and a need to develop a method for improving the adhesion of condensed foreign matter onto the interior surfaces of a process chamber.

SUMMARY OF THE INVENTION

The present invention generally provides a method of providing a texture to a surface of a workpiece. The method comprises providing a workpiece to a texturizing chamber and scanning a beam of electromagnetic energy across the surface of the workpiece to form a plurality of features thereon. The features that are formed are selected from the group consisting of depressions, protuberances, and combinations thereof.

Also provided is a method of reducing contamination in a process chamber. The method comprises scanning a beam of electromagnetic energy across a surface of one or more process chamber components to form a plurality of features thereon. The features that are formed are selected from the group consisting of depressions, protuberances, and combinations thereof. The method further comprises positioning the one or more chamber components into a process chamber and initiating a process sequence within the process chamber.

BRIEF DESCRIPTION OF THE DRAWINGS

So that the manner in which the above-recited features, advantages and objects of the present invention are attained can be understood in detail, a more particular description of the invention, briefly summarized above, may be had by reference to the embodiments thereof which are illustrated in the appended drawings.

DETAILED DESCRIPTION OF THE PREFERRED EMBODIMENT

Figure 1:
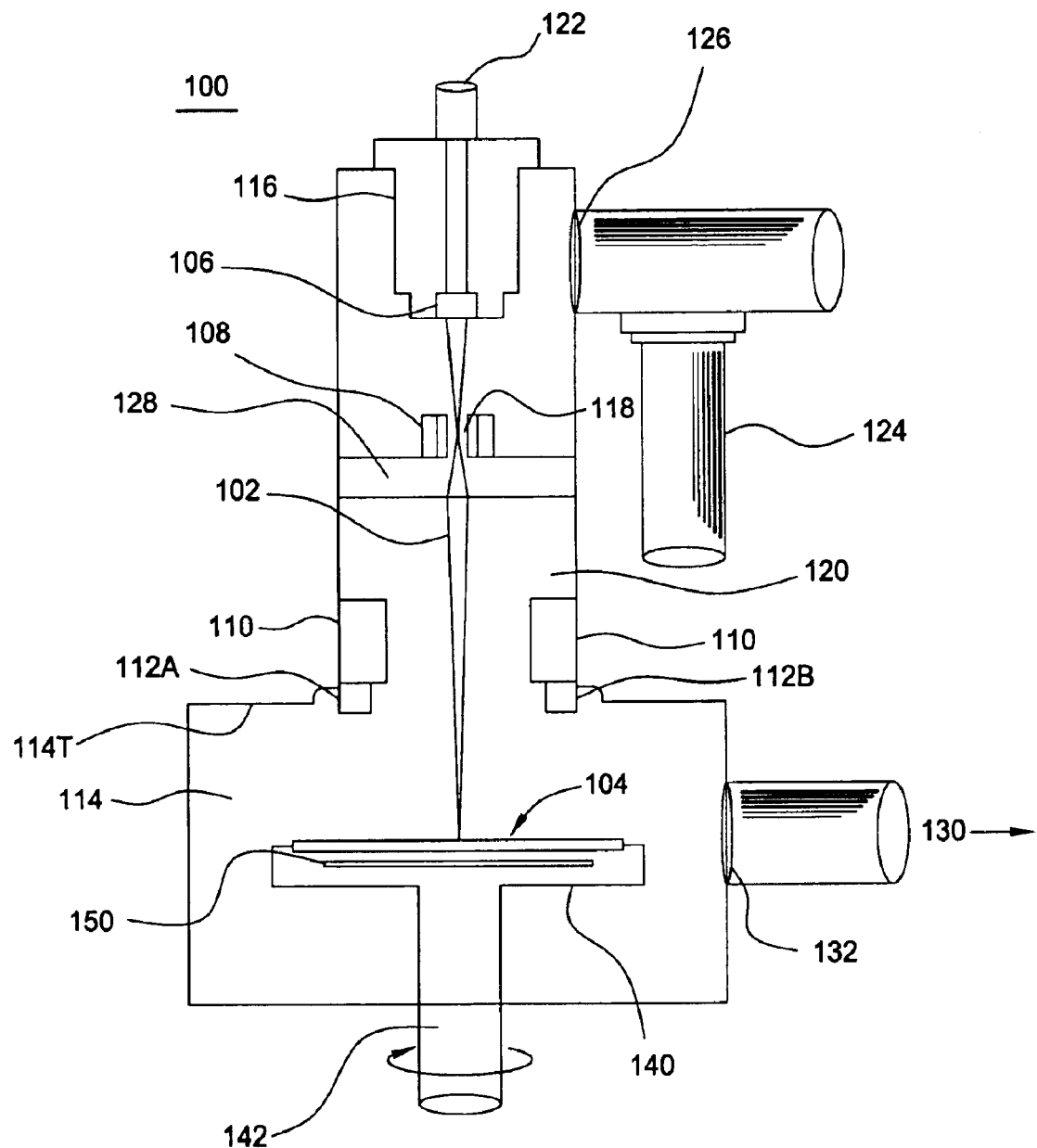
FIG. 1 depicts a schematic, cross-sectional illustration of a surface texturizing apparatus that may be used to practice embodiments described herein.

FIG. 1 depicts a cross-sectional, schematic view of surface texturizing apparatus 100 that may be used to modify the surface of a workpiece 104. Surface texturizing apparatus 100 generally comprises a column 120. Located within the column is a bias cup 116 surrounding a cathode 106. The cathode 106 may be, for example, a filament comprising a material such as tungsten. A high voltage cable 122 is coupled to the cathode 106.

Spaced apart from the cathode 106 and beneath the cathode 106 is an anode 108, and two pairs of high speed deflector coils 112a, 112b. A pass through hole 118 is formed within the anode 108. A fast focusing coil 110, typically circular in design and concentric with the column 120 is located beneath anode 108. The two pairs of high speed deflector coils 112a, 112b reside beneath the fast focusing coil 110. Coupled to, and below column 120 is a work chamber 114 with a top surface 114t. The work chamber 114 generally comprises a substrate support 140. The substrate support 140 may be coupled to an actuating means 142 for moving the substrate support 140, such as, for example, an actuator or rotating shaft that is capable of translating the workpiece 104 or rotating the workpiece 104 along one or more axes of rotation. Actuating means 142 moves the substrate relative to an electromagnetic beam 102. Electromagnetic beam 102 may be, for example, an electron beam. The substrate support 140 may further comprise a heating element 150, such as, for example, a resistive heater. An isolation valve 128 positioned between anode 108 and fast focusing coil 110 generally divides column 120, so that chamber 114 may be maintained at a pressure different from the portion of column 120 above the isolation valve 128.

A pump 124, such as, for example, a diffusion pump or a turbomolecular pump is coupled to column 120 via a valve 126. Pump 124 is used to evacuate column 120. Typically, a vacuum pump 130 is coupled to chamber 114 via an isolation valve 132 in order to evacuate chamber 114.

While FIG. 1 specifically depicts a surface texturizing apparatus comprising an electron beam, it is within the scope of the invention to use any beam of electromagnetic waves or particles, such as, for example, a beam of protons, neutrons, X-rays, etc. The surface texturizing apparatus generally comprises a means for controlling and focusing the particular beam onto the surface of the workpiece. The particular means employed to control and focus the beam generally depends upon the particular type of electromagnetic radiation employed.

Surface Texturizing Process

Figure 3:
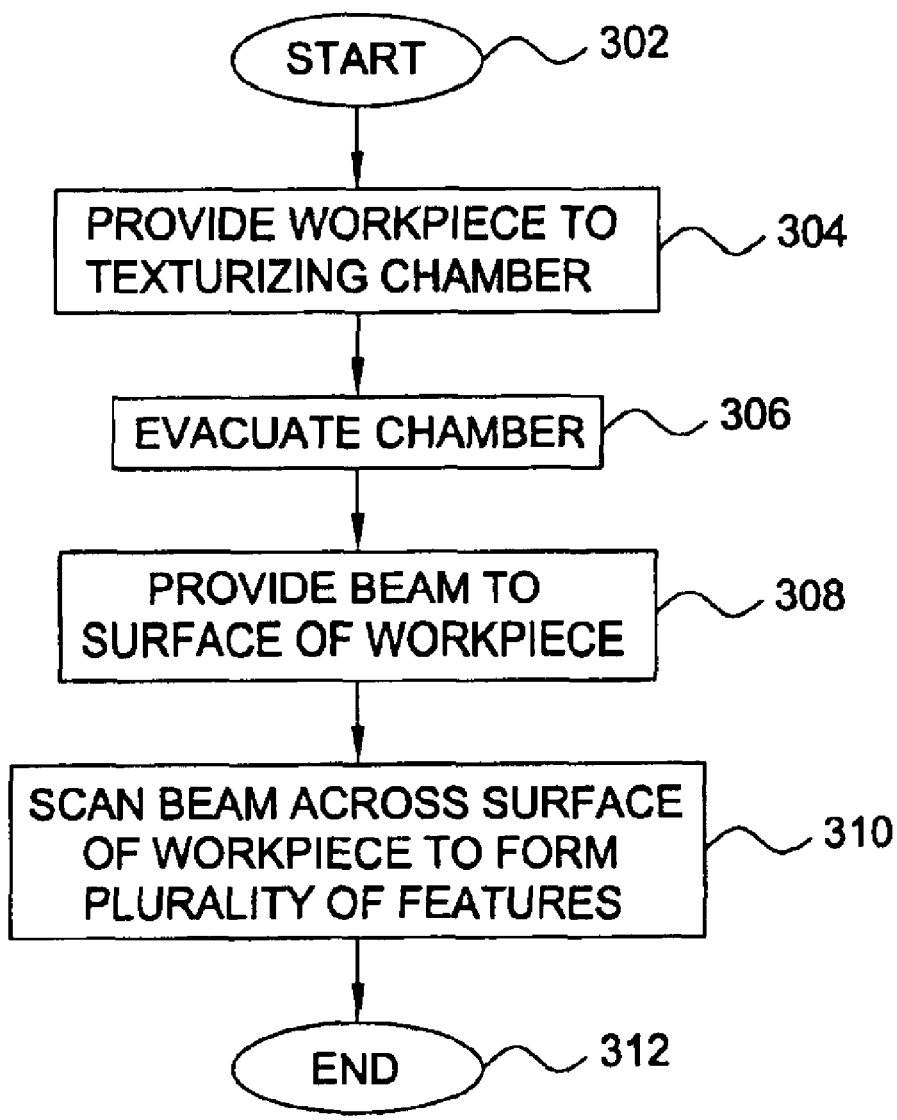
FIG. 3 depicts a series of method steps that may be used to modify a surface of a material using embodiments described herein.

A method for providing a texture to the surface of a workpiece 104 is depicted in FIG. 3. Specifically, a series of method steps 300 begins at step 302 and proceeds to step 304 wherein a workpiece 104 is provided to a surface texturizing chamber, such as chamber 114 of FIG. 1.

The workpiece generally comprises a material such as metal or metal alloy, a ceramic material, a polymer material, a composite material, or combinations thereof. In one embodiment, the workpiece comprises a material selected from the group consisting of steel, tantalum, tungsten, titanium, copper, aluminum, aluminum oxide, silicon oxide, and combinations thereof. In one embodiment, the workpiece comprises an austenitic-type steel. In another embodiment, the workpiece comprises quartz.

Referring to step 306, chamber 114 and column 120 are evacuated to a pressure in the range of about $1 \times 10^{-3}$ to $1 \times 10^{-5}$ torr. In one embodiment, an electron beam 102 is formed by heating cathode 106 using a resistive heater (not shown) and applying a current to the cathode using a power source (not shown). Electrons escape from the cathode and collect in the bias cup 116. A negative high voltage potential, referred to as an accelerating voltage is applied to the cathode 106 relative to the anode 108 via cable 122 and a secondary negative potential generally smaller in magnitude than the accelerating voltage is applied to the bias cup. The accelerating voltage may be in the range of about 60 to about 130 KV. The secondary potential is used to control the magnitude of electron beam energy that is delivered to the workpiece 104.

Electrons move through a pass through hole 118 in the anode and begin to diverge. Fast focusing coil 110 located beneath the anode 108 fouses the electron beam to a narrow diameter on the workpiece 104, while high speed deflector coils 112a, 112b magnetically deflect the beam to a particular location of the surface of workpiece 104. Electrical current is applied to the fast focusing coil 110 and to high speed deflector coils 112a, 112b in order to generate sufficient magnetic flux to manipulate the electron beam 102. Upon passing through fast focusing coil 110 and high speed deflector coils 112a, 112b, the electron beam is provided to the surface of the workpiece, as indicated in step 308 of FIG. 3. The distance betweeen the top surface 114t of chamber 114 and the workpiece 104 is the working distance of the beam. In one embodiment, the working distance is about 200 millimeters to about 350 millimeters.

Figure 2:
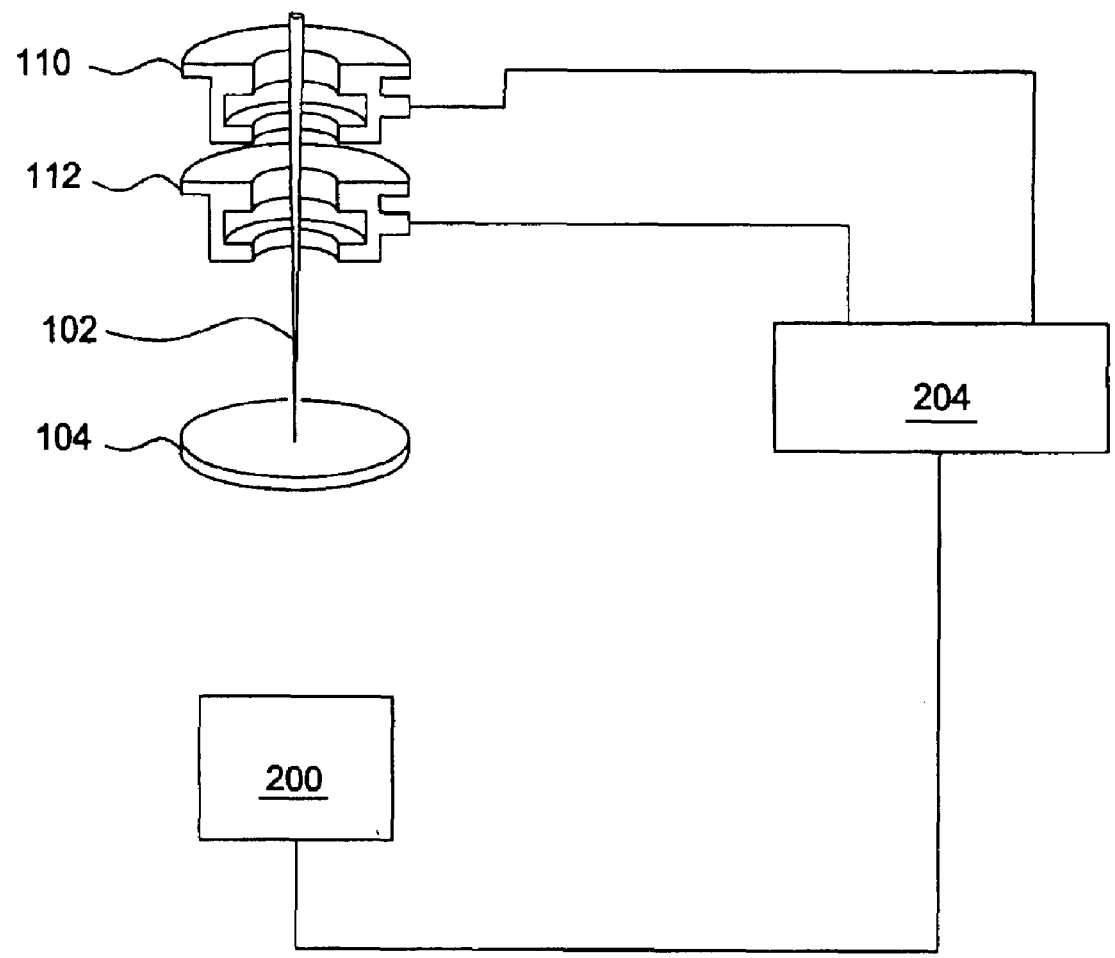
FIG. 2 depicts a schematic, cross-sectional view of a control system that may be coupled to a surface texturizing apparatus to practice embodiments described herein.

Referring to FIG. 2, a microprocessor controller 200 is preferably coupled to focusing coil 110 and high speed deflector coils 112a, 112b. The microprocessor controller 200 may be one of any form of general purpose computer processor (CPU) that can be used in an industrial setting for controlling various chambers and sub-processors. The computer may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located.

The software routines are executed upon positioning the workpiece 104 in chamber 114. The software routine, when executed, transforms the general purpose computer into a specific process computer that controls the chamber operation so that a chamber process is performed. Alternatively, the process of the present invention may be performed in hardware, as an application specific integrated circuit or other type of hardware implementation, or a combination of software or hardware.

Referring again to FIG. 2, typically a set of instructions is encoded onto a computer readable medium which is provided to controller 200. Control signals produced by executing the instructions are communicated to fast focusing coil 110 and high speed deflector coils 112a, 112b from controller 202 through one or more function generators 204. In one embodiment, instructions are communicated through five function generators 204. One of the five function generators is used for fast focusing. Two function generators are used for primary beam deflections and two function generators are used for secondary beam deflections. The function generators are accompanied by corresponding power amplifiers (not shown). The instructions typically enable the fast focusing coil 110 and high speed deflector coils 112a, 112b to manipulate the electron beam 102 by moving the beam to a particular location on the surface of the workpiece to create a specific pattern, spacing, and character of features onto the surface of the workpiece 104.

The function generators 204 are capable of generating signal wave shapes over various frequencies. This enables the position and focal diameter of electron beam 104 to adjust rapidly to signals originating from controller 200 and enable the rapid formation of features on the surface of the workpiece. The function generators 204 are preferably coupled to one or more power amplifiers, power supplies, etc (not shown). in order to facilitate communication of signals between the controller 200 and the focusing coil 110 as well as high speed deflector coils 112a, 112b.

As indicated in step 310 of FIG. 3 the beam 102 is scanned across the surface of the workpiece 104. Workpiece 104 may be heated prior to scanning the beam across a surface of the workpiece 104 to a pre-heat temperature. The pre-heat temperature is generally dependent upon the materials the workpiece 104 is constructed from. For example, workpiece 104 may be heated to a pre-heat temperature less than the temperature at which workpiece 104 begins to melt or undergo substantial decomposition. Workpiece 104 may be heated using, for example, heating element 150 shown in FIG. 1.

Figure 4:
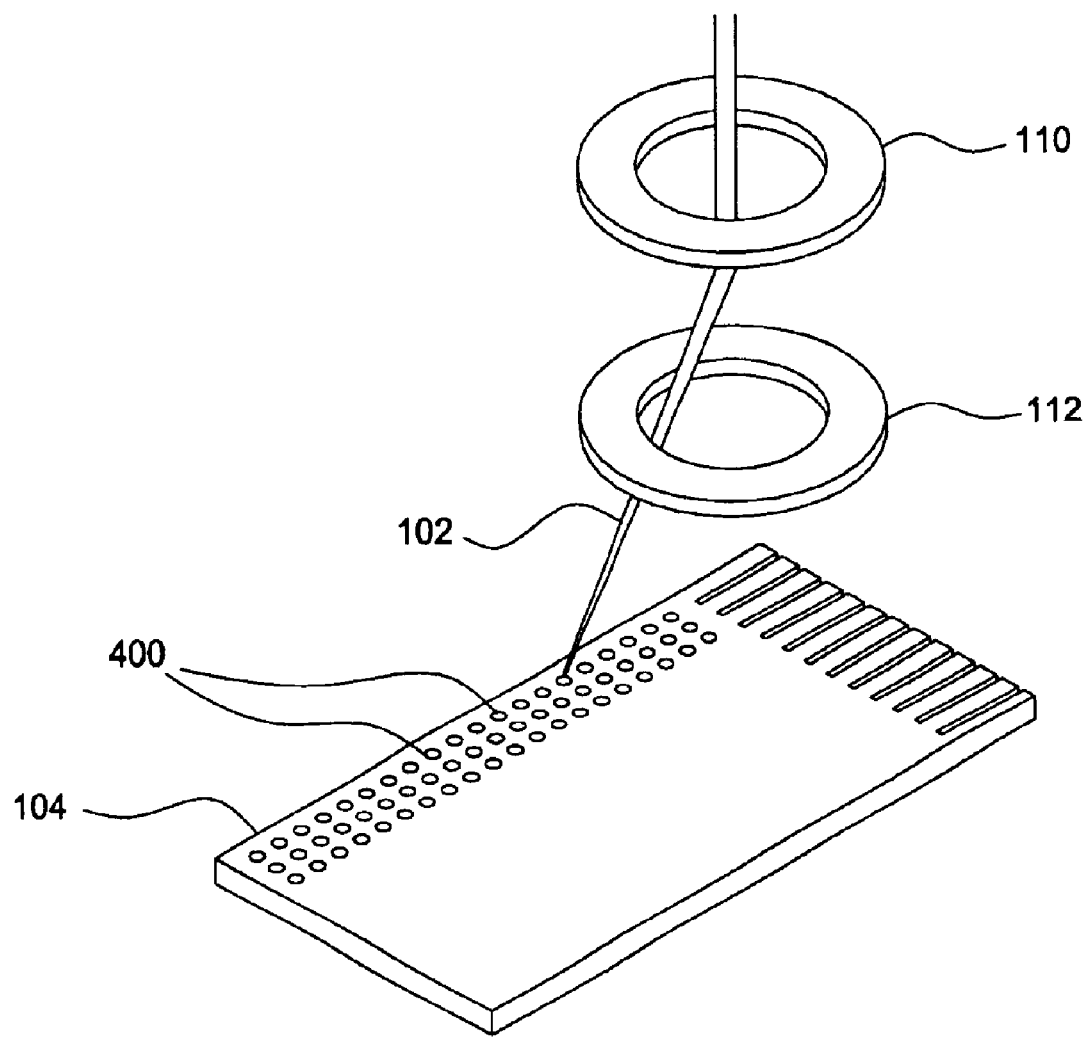
FIG. 4 depicts a schematic illustration of an electron beam sequentially contacting various portions of a workpiece in order to modify the surface thereof.

Referring to FIG. 4, the beam travels through the fast focusing coil 110 as well as high speed deflector coils 112. Depending upon the nature of the signals sent from controller 202, through function generators 204, the beam 202 is scanned across particular portions of the surface of workpiece 104. This results in a plurality of features 400 that are formed on the surface of the workpiece 104. The features 400 may be in a particular geometric pattern. In one embodiment, the workpiece 104 is moved with respect to the impinging beam 102 during the texturizing process. The workpiece may, for example be moved at a travel speed in the range of about 1 meter per minute to about 1.7 meters per minute with respect to beam 102. In one embodiment, the workpiece is rotated along one or more axes of rotation during exposure to the beam 102. The axis of rotation may be, for example, perpendicular or parallel to the incident beam. Method 300 ends with step 312.

In general, the beam 102 provides an electrical current to the workpiece 104. The beam current may be in the range of about 15 to about 24 milliamperes. The beam is further characterized as having a power density, equivalent to the power of the beam delivered across a particular cross-sectional area at a given location of the beam. The power density of the beam may be in the range of about $10^5$ W/mm$^2$ to about $10^7$ W/mm$^2$ at a point on the surface of the workpiece upon which the beam is focused.

In general, the beam has a spatial distribution of energy that varies depending upon the composition of the workpiece. The beam generally has a spatial distribution of energy that varies about a central value that may be, for example, a Guassian distribution. In one embodiment, the beam has a non-Guassian distribution. For example, the beam may have a spatial distribution of energy across the beam diameter which is substantially more uniform across the beam diameter than a Guassian distribution. In one embodiment, useful for treating austenitic steel, approximately 90% to about 95% of the beam energy is contained in a beam diameter of about 0.4 mm with the remaining energy outside the diameter of about 0.4 mm, but within a 1 mm diameter.

Figure 5A:
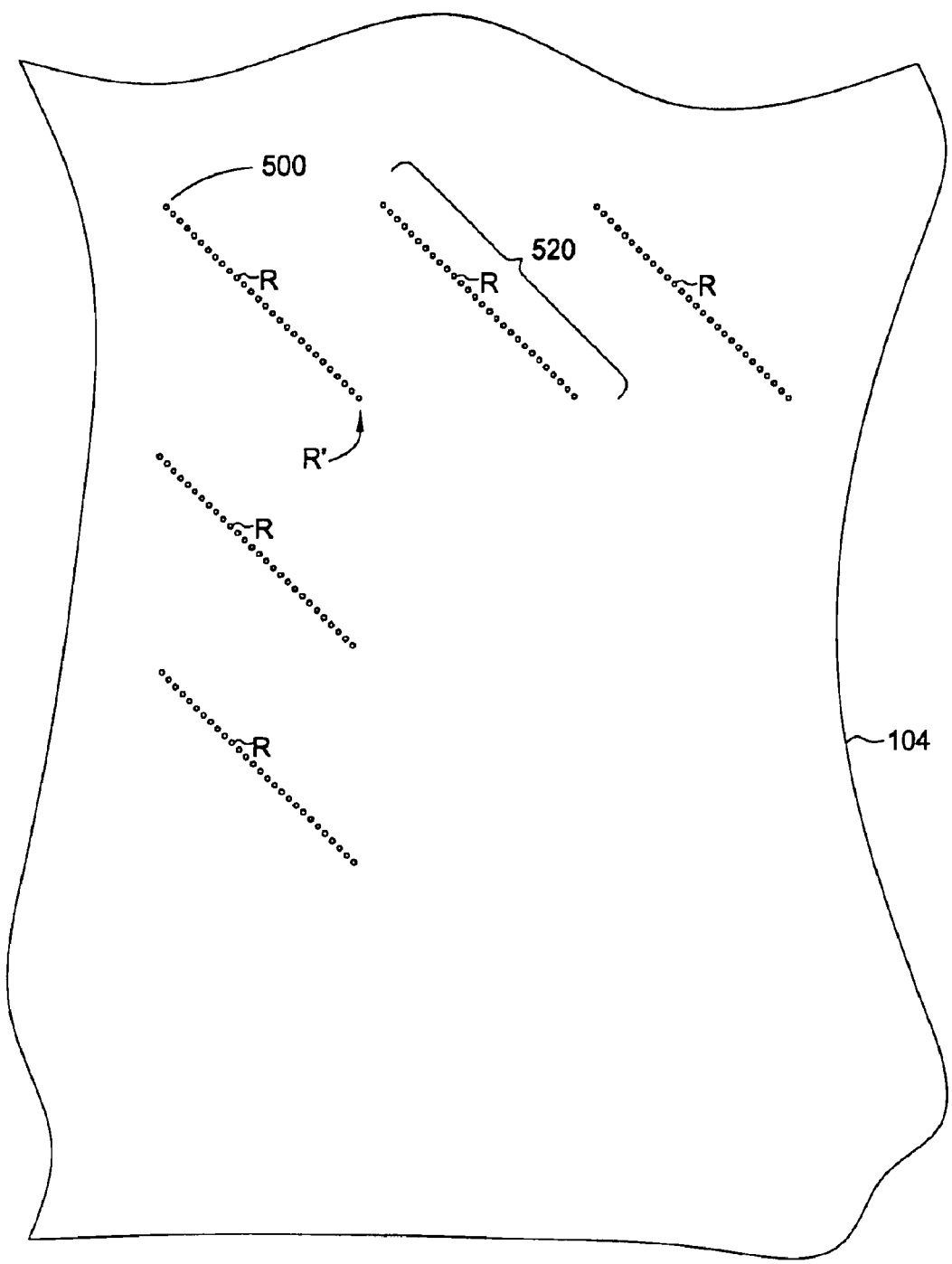
FIG. 5a depicts a schematic illustration of a top view of a workpiece surface that has been texturized using an embodiment described herein.

In one embodiment, the beam is scanned across the surface of the workpiece using high speed deflector coils 112a, 112b, but not using focus coil 110. In this embodiment, the beam remains focused throughout the texturizing process. FIG. 5a depicts a schematic illustration of a top view of a workpiece surface 104 that has been texturized. The beam undergoes a primary deflection using high speed deflector coils 112a, 112b. High speed deflector coils 112a, 112b move the beam in the vicinity of various reference points R. The beam is deflected between reference points R at a primarily deflection frequency. The primary deflection frequency may be in the range of about 23 to about 32 hertz. Once the beam is brought within the vicinity of a reference point, the beam undergoes a plurality of secondary deflections. Each secondary defelection results in the beam being moved to a secondary reference point, for example, R' as shown in FIG. 5a. Upon undergoing a particular secondary deflection, the beam interacts with the surface of the workpiece 104 in order to form a feature thereon. The secondary deflection frequency may be in the range of about 400 hertz to about 10 kilohertz. In one embodiment the secondary deflection frequency is in the range of about 2 kilohertz to about 4 kilohertz.

The secondary deflections may be spatially arranged such that the features 500 form a pattern 520 about reference point R. The pattern 520 depicted in FIG. 5a is a linear pattern. Other patterns are, of course, also possible, including, circular, elliptical, triangular, star-shaped, circular with center spot, among other patterns. The number of secondary deflections about each reference point R is variable, and may, for example, be up to about 100.

Figure 5B:
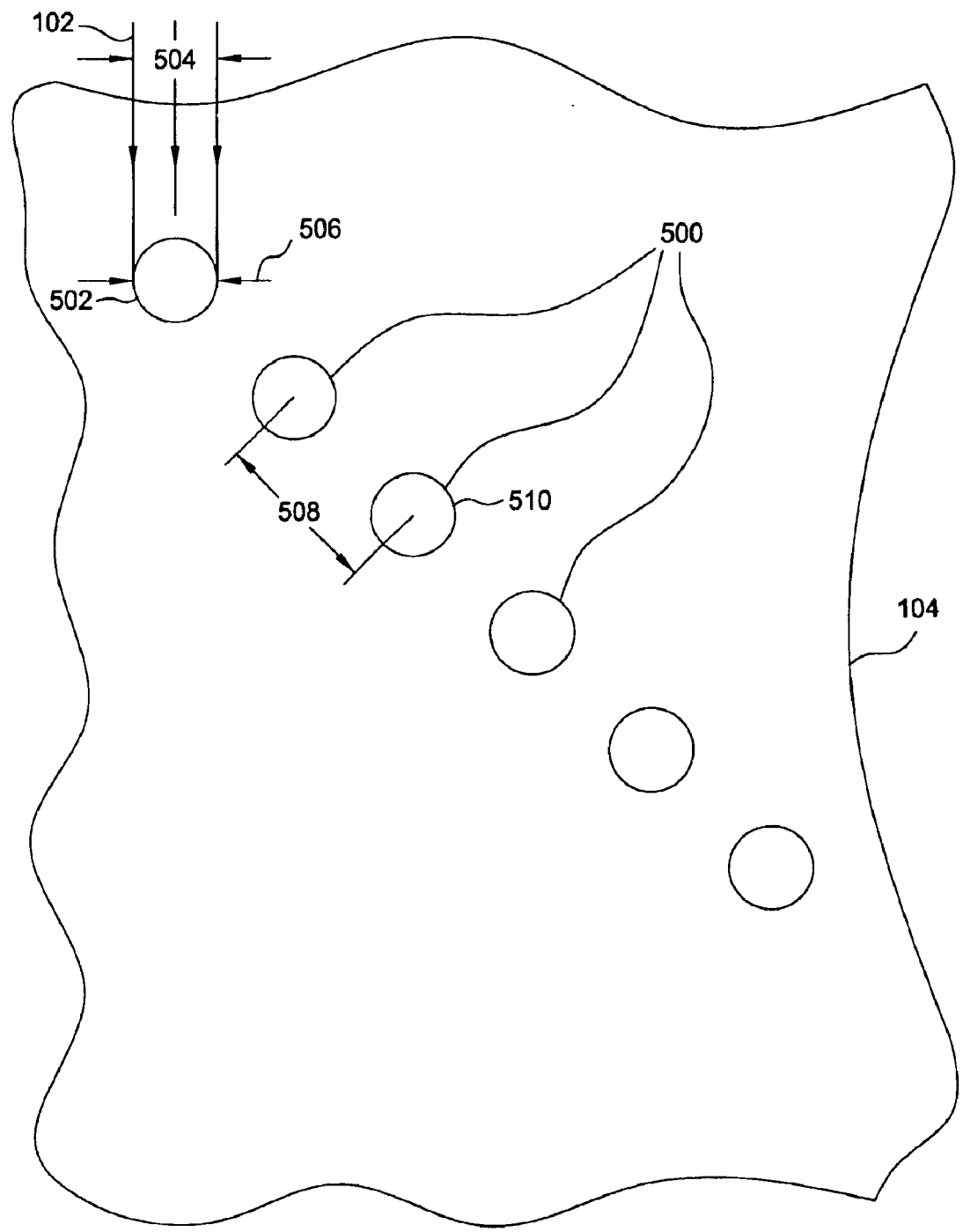
FIG. 5b depicts a close-up, top view of the workpiece surface of FIG. 5a and features thereon.

FIG. 5b depicts a close-up top view of the surface of workpiece 104 that has been texturized. The beam 102 has a beam diameter 504. The beam diameter 504 at the point in which beam 102 contacts the surface of the workpiece 102 may be about 0.4 mm dia. The beam focuses on region 502 on the surface of the workpiece 104, and remiains focused on region 502 for a period of time known as a dwell time. During the dwell time, the beam interacts with region 502 of the surface of the workpiece 104 to form a feature thereon.

As depicted in FIG. 5, the feature thus formed may have a diameter 506 that is substantially the same size of the beam diameter 504 at the point in which beam 102 contacts the surface of workpiece 104.

In general, the dwell time of the beam may be in the range of about 1 millisecond to about 2 milliseconds. The transit time that elapses between each secondary deflection may be about 1 microsecond to about 2 microseconds. The inventors have found that when employing such short transit times on materials such as austenitic steel, there is no need to defocus the beam or reduce the power during transit from one feature to the next. Surface exposed to the beam only during the beam transit time does not melt appreciably, thus features are only formed in those areas upon which the beam dwells. Once the dwell time has elapsed, the beam 102 is deflected to another region, such as region 510, on the surface of workpiece 104.

In another embodiment, the focus coil 110 moves the beam 102 rapidly in and out of focus in order to reduce the beam power impinging upon the surface of the workpiece 102 during transit time. In this manner the energy delivered to the surface of the workpiece 104 is more tightly controlled. Similarly to the method described aboove, a plurality of features 500 are formed on the surface of workpiece 104.

The plurality of features 500 may be depressions, protuberances, or combinations thereof. The plurality of features 500 may be arranged in a pattern with substantially uniform spacing 508 between features 500. While FIG. 5 depicts a pattern of discrete features 500, features 500 may contact, overlap, or merge with one another.

Figure 6:
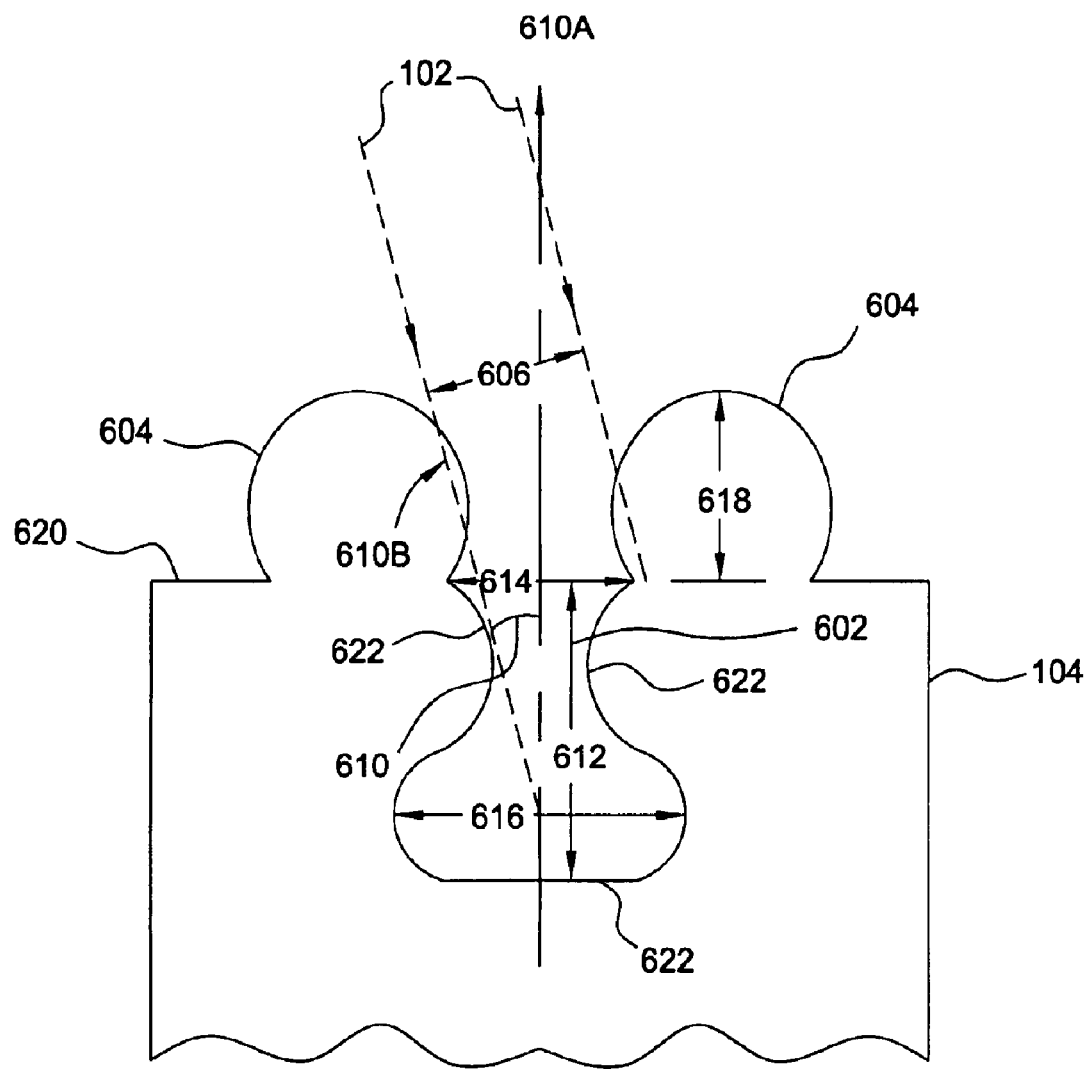
FIG. 6 depicts a schematic, cross-sectional illustration of a feature formed on a surface of a workpiece, according to an embodiment described herein.

FIG. 6 depicts a schematic, cross-sectional illustration of one embodiment of a surface of a workpiece 104 that has been contacted with an electromagnetic beam such as beam 102 having a beam diameter 606. The beam 102 passes through the fast focusing coil 110 as well as high speed deflector coils 112 and impacts the surface at an angle of incidence 610. The angle of incidence 610 is defined as the angle between a ray 610a normal to the surface of the workpiece 104 and a ray 610b parallel to beam 102. The angle of incidence may be in the range of about −6 degrees to about 6 degrees. Stated differently, the angle of incidence may be within about 6 degrees measured with respect to a ray 610a. Several features 600, including a depression 602 and protuberances 604 are formed upon exposure to beam 102.

While the inventors do not wish to be held to any one particular explanation behind the formation of these features 600, it is believed that material on the surface and on the interior of the workpiece 104 is heated to a high temperature, in some cases above the boilng temperature of the material comprising the workpiece 104. The rapid heating of portions of the workpiece causes material to be ejected outwards. This forms depression 602 in a location from which the material has been ejected, and also forms protuberances 604 in locations to which the ejected material has deposited.

The depression 602 is characterized as having a surface 622. The depression 602 has a depth 612, defined as the perpendicular distance from top surface 620 of the workpiece 104 to the bottom of the depression 602, in the range of about 0.001 inches to 0.015 inches. The depression has a surface diameter 614 in the range of about 0.005 inches to 0.040 inches. The depression has an interior diameter 616. The interior diameter 616 is defined as the greatest distance between two points on surface 622, parallel to top surface 620 of workpiece 104. In one embodiment, the depression has an interior diameter 616 greater than the surface diameter 614. In one embodiment, protuberances 604 have a height 618 that is in the range of about 0.005" to 0.025".

While FIG. 6 depicts the specific formation of features, including a depression 602 and two protuberances 604, it is within the scope of the invention to form only depressions or only protuberances, or varying ratios and combinations of depressions and proteuberances. Furthermore the depressions may have varying shapes, depths, surface diameters, and interior diameters. Similarly, the protuberances may have varying shapes and heights as well as varying angles of contact with the workpiece surface. The protuberances and depressions may contact, overlap, or merge with one another or be spaced apart from one another. In one embodiment, the spacing between protuberances or between depressions is less than about 0.02 inches.

In one embodiment, the workpiece 104 is sprayed with a stream of hard particles ("bead blasting") after the surface texturizing treatment with the electromagnetic beam 102. The hard particles may comprise, for example, aluminum oxide or silicon oxide, and may have a particle size of about 36 to about 80 grit (about 535 microns to about 192 microns). The hard particles may be sprayed from a nozzle and may be sprayed dry or as a part of an aqueous slurry composition. In general, the bead blasting treatment introduces roughness on the surface of the workpiece 104 that is finer than the roughness generated by using the electromagnetic beam 102.

Method of Reducing Particle Contamination

In another embodiment of the invention, a method of reducing contamination in a process chamber is provided. In one embodiment, the method reduces contamination of a substrate provided to the process chamber. In general, the chamber may be any enclosed or partially enclosed chamber that may be susceptible to materials condensing on interior surfaces of the chamber or on surfaces of components within the chamber. In one embodiment, the chamber is a wafer processing chamber. The chamber may be one in which is suitable for vacuum processsing of wafer substrates. The wafer processing chamber may be, for example, a deposition chamber. Representative deposition chambers include sputtering, physical vapor deposition (PVD) and ion metal plasma (IMP) chambers, chemical vapor deposition (CVD) chambers, atomic layer depositon (ALD) chambers, among others. The chamber may be, for example, an etch chamber, such as a plasma etch chamber. Other examples of suitable process chambers include ion implantation chambers, annealing chambers, etch chambers as well as other furnace chambers. In a preferred embodiment, the chamber is a wafer process chamber in which a wafer substrate is exposed to one or more gas-phase materials.

Figure 7:
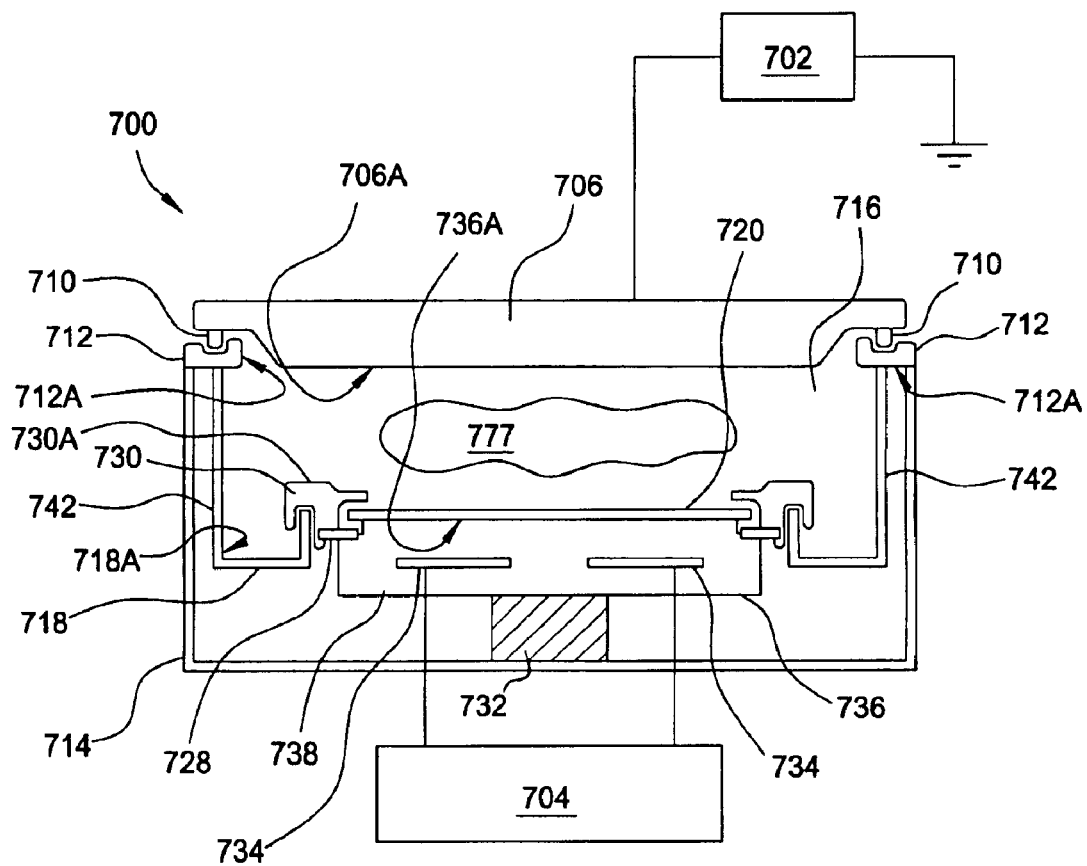
FIG. 7 depicts a schematic, cross-sectional, illustration of a sputtering reactor in which contamination may be reduced using embodiments described herein.

FIG. 7 illustrates a simplified schematic cross-sectional illustration of a sputtering reactor 700 in which contamination may be reduced using embodiments described herein. The reactor 700 contains a vacuum chamber 716 and a substrate support 736 having a top surface 736a. The substrate support 736 may be, for example, an electrostatic chuck. Reactor 700 further comprises a shield assembly 718 and an elevator system 732. A substrate 720 (e.g., a semiconductor wafer) is positioned upon top surface 736a of the substrate support 736. In the exemplary arrangement, the substrate support 736 is attached, as by a plurality of screws, to a conventional vertically movable elevator system 732. Certtain hardware such as gas inlet manifolds and/or vacuum pumps are omitted for clarity.

The exemplary vacuum chamber 716 includes a cylindrical chamber wall 714 and a support ring 712 which is mounted to the top of the chamber wall. The top of the chamber is closed by a target plate 706 which has an interior surface 706a. The target plate 706 is electrically insulated from the chamber walls 714 by an annular insulator 710 that rests between the target plate 706 and the support ring 712. Generally, to ensure the integrity of the vacuum in the chamber 716, o-rings (not shown) are used above and below the insulator 710 to provide a vacuum seal. The target plate 706 may be fabricated of a material that will become the deposition species or it may contain a coating of the deposition species. To facilitate the sputtering process, a high voltage power supply 702 is connected to the target 706.

The substrate support 736 retains and supports substrate 720 within the chamber 716. The substrate support 736 may contain one or more electrodes 734 imbedded within a support body 738. The electrodes are driven by a voltage from an electrode power supply 704 and, in response to application of the voltage, the substrate 720 is electrostatically clamped to the support surface of the chuck. The chuck body may comprise, for example, a ceramic material.

A wall-like cylindrical shield member 742 is mounted to the support ring 712. The cylindrical shape of the shield member 742 is illustrative of a shield member that conforms to the shape of the chamber and/or the substrate. The shield member 742 may, of course, be of any shape.

In addition to the shield member 742, the shield assembly 718 also includes an annular shadow ring 730 having an inner diameter which is selected so that the ring fits peripherally over the edge of the substrate 720 without contacting the substrate. The shadow ring rests upon an alignment ring 728 and the alignment ring 728 is supported by a flange (not shown) that extends from the substrate support 736.

During a sputter deposition process, process gas is supplied to the chamber and power is supplied to target plate 706. The process gas is ignited into a plasma and is accelerated toward the target plate 706. The process gas thereby dislodges particles from the target plate and the particles deposit onto substrate 720 forming a coating of deposited material thereon.

While the shield assembly 718 generally confines the plasma and sputtered particles within a reaction zone 777, inevitably, sputtered particles, initally in a plasma or gaseous state, condense on various interior chamber surfaces. For example, sputtered particles may condense on an interior surface 718a of shield assembly 718, on interior surface 706a of target plate 706, on an interior surface 712a of support ring 712, on an interior surface 730a of shadow ring 730, as well as other interior chamber surfaces. Furthermore, other surfaces, such as the top surface 736a of substrate support 736 may become contaminated either during or in between deposition sequences.

In general the term "interior surface" refers to any surface that has an interface with chamber 716. Chamber component refers to any detachable element housed completely or partially within a process chamber. The chamber component may be a vacuum chamber component, ie, a chamber component placed within a vacuum chamber, such as, for example, chamber 716. The condensed matter that forms on the interior surface of a chamber component, generally has only limited adhesion, and may release from the component and contaminate the substrate 720.

In order to reduce the tendency of condensed foreign matter to detach from a process chamber component, the chamber component, such as, for example, a shield assembly 718, a target 706, a support ring 712, or a substrate support 736, is provided to a texturizing chamber, such as, for example, work chamber 114 of apparatus 100.

Figure 8:
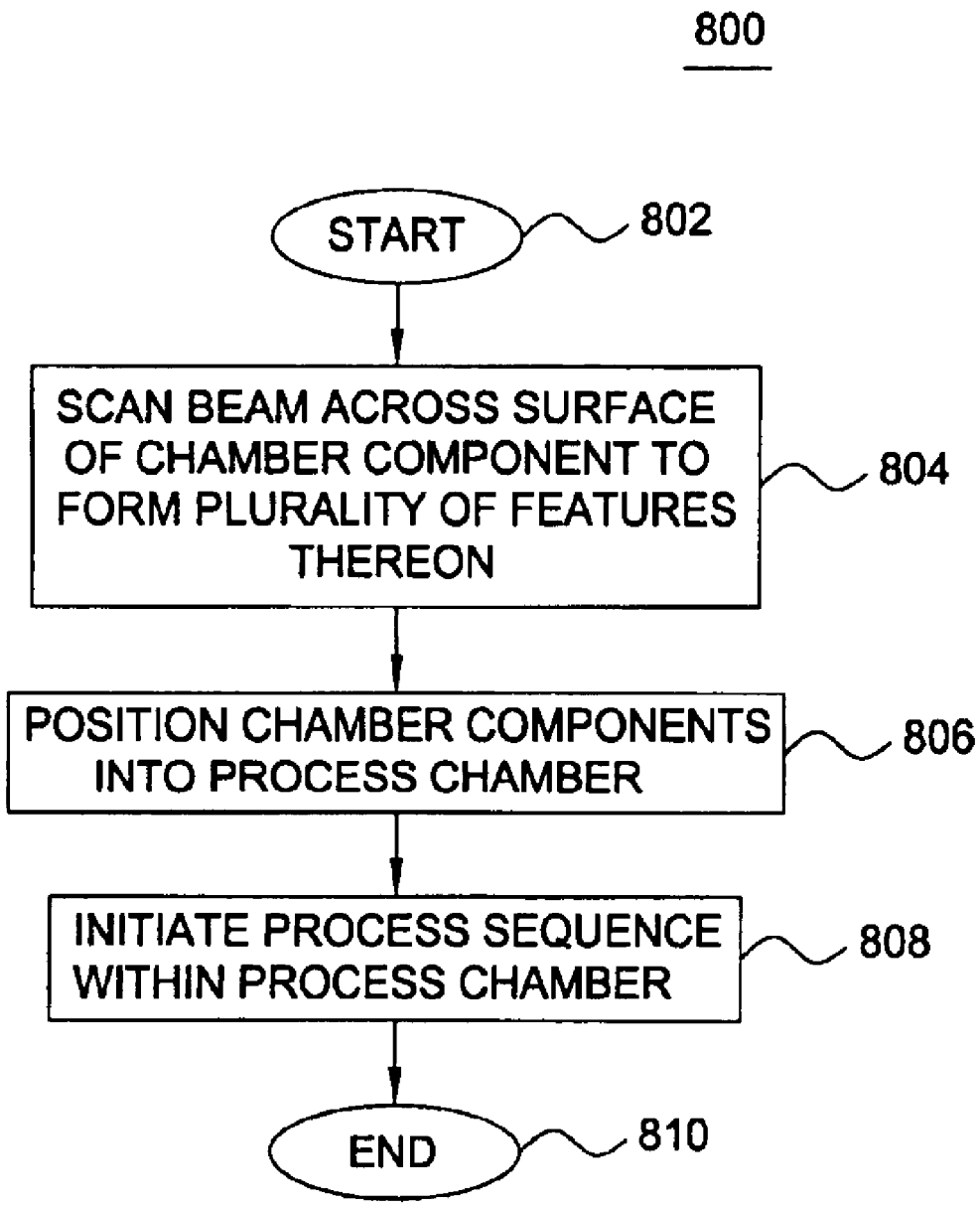
FIG. 8 depicts a series of method steps that may be used to reduce contamination in a process chamber using embodiments described herein.

Referring now to FIG. 8, a series of method steps 800 begins at step 802 and proceeds to step 804 wherein a beam of electromagnetic energy is scanned across the surface of one or more chamber components to form a plurality of features thereon. The features may be depressions, protuberances, or combinations thereof. The nature of features including depressions and protuberances thus formed on the surface of the chamber component are as for workpiece 104 described previously.

In an alternate embodiment, the method further comprises spraying the chamber component with a stream of hard particles ("bead blasting") after the surface texturizing treatment of step 804. The hard particles may comprise, for example, aluminum oxide or silicon oxide, and may have a particle size of about 36 to about 80 grit (about 535 microns to about 192 microns).

Referring to step 806, the one or more chamber components are then positioned within a process chamber, such as, for example, chamber 716 in sputtering reactor 700. As indicated in step 808, a process sequence is intitiated within the reactor, such as forming a sputtered layer on substrate 720 within reactor 700. The method ends with step 810.

In one embodiment, the one or more chamber components are positioned within a line-of-sight distance of a top surface of a substrate support, such as top surface 736a of substrate support 736. A chamber component is within a line-of-sight distance of a top surface of a substrate support if a straight line can be drawn between any portion of the chamber component and any portion of the top surface of the substrate support without contacting another surface.

While the above discussion details a method of reducing contamination in a sputtering reactor, it is within the scope of the invention to use a method to reduce contamination in any number of process chambers. The present invention is applicable to any process chamber comprising an interior surface upon which materials may condense. Any component partially or completely within the process chamber of a process chamber that may be removed from the chamber and placed in a texturizing apparatus, such as apparatus 100, is suitable to be treated using a method of the present invention.

The method may be used to reduce contamination in process chambers designed to deposit, etch, heat, or otherwise modify a workpiece, substrate, or layer disposed therein. In one embodiment, the method is used to reduce contamination in a chamber that is designed to sputter deposit a layer of refractory metal or refractory metal compound such as a layer of titanium, titanium nitride, tantalum, or tantalum nitride on a substrate.

In another embodiment, the one or more chamber components are removed from the process chamber after step 808 and a process to remove condensed foreign matter matter that may be adherent to the texturized surfaces is initiated.

The removal of condensed foreign matter may be accomplished by spraying the surface of the one or more process chamber components with a stream of hard particles. The hard particles may comprise, for example, aluminum oxide or silicon oxide, and may have a particle size of about 36 to about 80 grit. Preferably, the spraying is sufficient to remove the freign matter without substantially modifying the texture (i.e., the depressions and protuberances) on the surface of the component.

In another embodiment, a chemical fluid is applied to the surface of the one or more process chamber components in order to remove condensed foreign matter thereon. The chemical fluid treatment may comprise for example, soaking or spraying the surface with chemicals such as degreasing compositions, sodium hydroxide, potassium permanganate, nitric acid, hydrofluoric acid, hydrochloric acid, and combinations thereof.

The treatment with chemical fluids may be in addition to or in place of spraying with hard particles. Alternatively, other methods of removing foreign matter from the texturized surfaces surfaces are also contemplated. Preferably, the chemical treatment does not reduce the macro-roughness of the depressions formed during the texturizing process. In this manner the component may be replaced into the chamber and once again provide enhanced adhesion for matter that condenses on the surface.

Although several preferred embodiments which incorporate the teachings of the present invention have been shown and described in detail, those skilled in the art can readily devise many other varied embodiments that still incorporate these teachings.

What is claimed is:

1. A method of providing a texture to a surface of a workpiece comprising:
   scanning a beam of electromagnetic energy across the surface of the workpiece to form a plurality of features thereon, wherein the features that are formed are selected from the group consisting of depressions, protuberances, and combinations thereof and the beam has a spatial distribution of enemy in which about 90% to about 95% of the beam energy is concentrated within about 40% of the beam area.

2. The method of claim 1 wherein the workpiece is a chamber component.

3. The method of claim 1 further comprising deflecting the beam at a deflection frequency in a range of about 400 hertz to about 10 kilohertz such that the beam impinges upon a plurality of reference points in order to form the plurality of features thereon.

4. The method of claim 3 wherein the deflection frequency is in a range of about 2 kilohertz to about 4 kilohertz.

5. The method of claim 1 further comprising deflecting the beam at a primary deflection frequency in a range of about 23 hertz to about 32 hertz and deflecting the beam at a secondary deflection frequency in a range of about 400 hertz to about 10 kilohertz.

6. The method of claim 1 wherein the beam is an electron beam.

7. The method of claim 1 wherein the workpiece comprises a material with a boiling temperature and the beam delivers sufficient energy to the workpiece to heat portions thereof to a temperature above the boiling temperature in order to create the plurality of features thereon.

8. The method of claim 1 wherein the beam has a beam current in a range of about 15 to about 24 milliamperes.

9. The method of claim 1 wherein the beam has a power density at a point on the surface of the workpiece upon which the beam is focused in a range of about $10^5$ W/mm$^2$ to about $10^7$ W/mm$^2$.

10. The method of claim 1 wherein the beam is produced using an accelerating voltage in a range of about 60 to about 130 KV.

11. The method of claim 1 wherein the beam impacts the surface at an angle of incidence less than about 6 degrees.

12. The method of claim 1 wherein the beam has a dwell time in a range of about 1 millisecond to about 2 milliseconds.

13. The method of claim 1 wherein the beam has a beam diameter of about 0.4 to about 0.6 millimeters.

14. The method of claim 1 wherein the workpiece is positioned in a texturizing chamber and the texturizing chamber is pumped to a pressure in a range of about $10^{-3}$ torr to about $10^{-5}$ torr.

15. The method of claim 1 wherein the features comprise depressions having a surface diameter in a range of 0.005 inches to 0.040 inches.

16. The method of claim 1 wherein the features comprise depressions having a depth in a range of 0.001 inches to 0.015 inches.

17. The method of claim 1 wherein the features comprise depressions having an interior diameter greater than a surface diameter.

18. The method of claim 1 wherein the features comprise protuberances having a height in a range of about 0.005 inches to about 0.025 inches.

19. The method of claim 1 wherein the workpiece comprises a material selected from the group consisting of: steel, titanium, tantalum, tungsten, copper, aluminum, aluminum oxide, silicon oxide, and combinations thereof.

20. The method of claim 3 wherein a transit time elapses between the impingement of the beam on the plurality of reference points and wherein the beam has a power density that remains essentially constant throughout the duration of the transit time.

21. A method of providing a texture to a surface of a component for use in a semiconductor process chamber comprising:
scanning an electron beam across the surface of the chamber component for a sufficient period of time to form a plurality of depressions thereon, wherein the electron beam has a power density at a point on the surface of the component upon which the beam is focused in a range of about $10^5$ W/mm$^2$ to about $10^7$ W/mm$^2$ and the electron beam has a spatial distribution of energy in which about 90% to about 95% of the beam energy is concentrated within about 40% of the beam area.

22. A method of providing a texture to a surface of a component for use in a semiconductor process chamber comprising:
positioning a chamber component in a texturizing chamber;
pumping the texturizing chamber to a pressure in a range of about $10^{-3}$ torr to about $10^{-5}$ torr; and
deflecting an electron beam across the surface of the chamber component at a deflection frequency greater than about 1 kilohertz for a sufficient period of time to form a plurality of depressions thereon, wherein the electron beam has a power density at a point on the surface of the component upon which the beam is focused in a range of about $10^5$ W/mm$^2$ to about $10^7$ W/mm$^2$ and the electron beam has a spatial distribution of energy in which about 90% to about 95% of the beam energy is concentrated within about 40% of the beam area.

23. The method of claim 1 further comprising heating the workpiece to a pre-heat temperature prior to scanning the electromagnetic beam, wherein the pre-heat temperature is less than a temperature at which the workpiece begins to melt, flow, or undergo substantial decomposition.

24. A method of reducing contamination in a process chamber comprising the steps of:
(a) scanning a beam of electromagnetic energy across a surface of one or more process chamber components to form a plurality of features thereon, wherein the features that are formed are selected from the group consisting of depressions, protuberances, and combinations thereof and the beam has a spatial distribution of energy in which about 90% to about 95% of the beam energy is concentrated within about 40% of the beam area.
(b) positioning the one or more chamber components into a process chamber; and
(c) initiating a process sequence within the process chamber.

25. The method of claim 24 wherein step (a) comprises deflecting the beam at a deflection frequency in a range of about 400 hertz to about 10 kilohertz.

26. The method of claim 25 wherein the deflection frequency is in a range of about 2 kilohertz to about 4 kilohertz.

27. The method of claim 24 wherein step (a) comprises deflecting the beam at a primary deflection frequency in a range of about 23 hertz to about 32 hertz and deflecting the beam at a secondary deflection frequency in a range of about 400 hertz to about 10 kilohertz.

28. The method of claim 24 wherein the beam is an electron beam.

29. The method of claim 24 wherein the one or more process chamber components comprise a material with a boiling temperature and the beam delivers sufficient energy to the one or more process chamber components to heat portions thereof to a temperature above the boiling temperature in order to create the plurality of features thereon.

30. The method of claim 24 wherein the beam has a beam current in a range of about 15 to about 24 milliamperes.

31. The method of claim 24 wherein the beam has a power density at a point on the surface of the process chamber component upon which the beam is focused in a range of about $10^5$ W/mm$^2$ to about $10^7$ W/mm$^2$.

32. The method of claim 24 wherein the beam is produced using an accelerating voltage in a range of about 60 to about 130 KV.

33. The method of claim 24 wherein the beam impacts the surface at an angle of incidence less than about 6 degrees.

34. The method of claim 24 wherein the beam has a dwell time in a range of about 1 millisecond to about 2 milliseconds.

35. The method of claim 24 wherein the beam has a beam diameter within a range of about 0.4 millimeters to about 0.6 millimeters.

36. The method of claim 24 wherein step (a) further comprises providing one or more process chamber components to a texturizing chamber and pumping the texturizing chamber to a pressure in a range of about $10^{-3}$ torr to about $10^{-5}$ torr.

37. The method of claim 24 wherein the features comprise depressions having a surface diameter 0.005 inches to 0.040 inches.

38. The method of claim 24 wherein the features comprise depressions having a depth in a range of about 0.001 inches to 0.015 inches.

39. The method of claim 24 wherein the features comprise depressions having an interior diameter greater than a surface diameter.

40. The method of claim 24 wherein the features comprise protuberances having a height in a range of about 0.005 inches to 0.025 inches.

41. The method of claim 24 wherein the one or more process chamber components comprise a material selected from the group consisting of: steel, titanium, tantalum, tungsten, copper, aluminum, aluminum oxide, silicon oxide, and combinations thereof.

42. The method of claim 24 further comprising heating the process chamber component to a pre-heat temperature prior to step (b), wherein the pre-heat temperature is less than a temperature at which the process chamber component begins to melt, flow, or undergo substantial decomposition.

43. The method of claim 24 wherein the process chamber comprises a substrate support.

44. The method of claim 43 wherein the one or more chamber components are positioned within a line-of-sight of the substrate support.

45. The method of claim 24 further comprising:
  (d) removing the one or more components from the process chamber after step (c); and
  (e) initiating a process to remove condensed foreign matter from the surface of the one or more components.

46. The method of claim 45 wherein step (e) comprises spraying the surface of the one or more process chamber components with a stream of hard particles.

47. The method of claim 45 wherein step (e) comprises applying a chemical fluid to the surface of the one or more process chamber components.

48. A method of reducing contamination in a process chamber comprising the steps of:
  (a) scanning an electron beam across a surface of one or more process chamber components by deflecting the beam at a deflection frequency in the range of about 2 kilohertz to about 4 kilohertz to form a plurality of depressions thereon, wherein the plurality of depressions have a surface diameter of about 0.005 inches to about 0.040 inches and the electron beam has a spatial distribution of energy in which about 90% to about 95% of the beam enemy is concentrated within about 40% of the beam area;
  (b) positioning the one or more chamber components into a process chamber; and
  (c) initiating a process sequence within the process chamber.

49. A component for use in a process chamber wherein the component comprises one or more surfaces with a plurality of features, wherein the features have been formed by scanning a beam of electromagnetic energy across a surface of the component, wherein the features that are formed are selected from the group consisting of depressions, protuberances, and combinations thereof, and wherein the beam has a spatial distribution of energy in which about 90% to about 95% of the beam energy is concentrated within about 40% of the beam area.

50. The component of claim 49 further wherein the scanning comprises deflecting the beam at a deflection frequency in a range of about 400 hertz to about 10 kilohertz.

51. The component of claim 49 wherein the deflection frequency is in a range of about 2 kilohertz to about 4 kilohertz.

52. The component of claim 49 wherein further comprising deflecting the beam at a primary deflection frequency in a range of about 23 hertz to about 32 hertz and deflecting the beam at a secondary deflection frequency in a range of about 400 hertz to about 10 kilohertz.

53. The component of claim 49 wherein the beam is an electron beam.

54. The component of claim 49 wherein the workpiece comprises a material with a boiling temperature and the beam delivers sufficient energy to the workpiece to heat portions thereof to a temperature above the boiling temperature in order to create the plurality of features thereon.

55. The component of claim 49 wherein the beam has a beam current in a range of about 15 to about 24 milliamperes.

56. The component of claim 49 wherein the beam has a power density at a point on the surface of the workpiece upon which the beam is focused in a range of about $10^5$ $W/mm^2$ to about $10^7$ $W/mm^2$.

57. The component of claim 49 wherein the beam is produced using an accelerating voltage in a range of about 60 to about 130 KV.

58. The component of claim 49 wherein the beam impacts the surface at an angle of incidence less than about 6 degrees.

59. The component of claim 49 wherein the beam has a dwell time in a range of about 1 millisecond to about 2 milliseconds.

60. The component of claim 49 wherein the beam has a beam diameter of about 0.4 to about 0.6 millimeters.

61. The component of claim 49 wherein the workpiece is in a texturizing chamber and the texturizing chamber is pumped to a pressure in a range of about $10^{-3}$ torr to about $10^{-5}$ torr.

62. The component of claim 49 wherein the features comprise depressions having a surface diameter in a range of 0.005 inches to 0.040 inches.

63. The component of claim 49 wherein the features comprise depressions having a depth in a range of 0.001 inches to 0.015 inches.

64. The component of claim 49 wherein the features comprise depressions having an interior diameter greater than a surface diameter.

65. The component of claim 49 wherein the features comprise protuberances having a height in a range of about 0.005 inches to 0.025 inches.

66. The component of claim 49 wherein the workpiece comprises a material selected from the group consisting of: steel, titanium, tantalum, tungsten, copper, aluminum, aluminum oxide, silicon oxide, and combinations thereof.

67. The component of claim 49 wherein the component is heated to a pre-heat temperature prior to the scanning step, and wherein the pre-heat temperature is less than a temperature at which the workpiece begins to melt, flow, or undergo substantial decomposition.

68. A component for use in a process chamber, comprising:
  a body having one or more surfaces; and
  a plurality of features formed on the surfaces, wherein the features have been formed by scanning a beam of electromagnetic energy across a surface of the component, and wherein the features that are formed are selected from the group consisting of depressions, protuberances, and combinations thereof, and wherein the surfaces are further prepared by a bead blasting treatment.

69. The component of claim 68 wherein the component is selected from the group of a chamber shield, a target, a shadow ring and a substrate support.

70. The component of claim 68 wherein the component is made of a material selected from the group of steel, titanium, tantalum, tungsten, copper, aluminum, aluminum oxide, silicon oxide, quartz, VESPEL and combinations thereof.

71. The component of claim 68 wherein the features comprise depressions having a surface diameter in a range of 0.005 inches to 0.040 inches.

72. The component of claim 68 wherein the features comprise depressions having a depth in a range of 0.001 inches to 0.015 inches.

73. The component of claim 68 wherein the features comprise depressions having an interior diameter greater than a surface diameter.

74. The component of claim 68 wherein the features comprise protuberances having a height in a range of about 0.005 inches to about 0.025 inches.

* * * * *

UNITED STATES PATENT AND TRADEMARK OFFICE
CERTIFICATE OF CORRECTION

PATENT NO. : 6,933,508 B2  
APPLICATION NO. : 10/099307  
DATED : August 23, 2005  
INVENTOR(S) : Alan R. Popiolkowski et al.

It is certified that error appears in the above-identified patent and that said Letters Patent is hereby corrected as shown below:

Column 2, Line 23: After "attained", insert --and--

Column 2, Line 51: Delete the comma after "cross-sectional"

Column 4, Line 63: Delete the period after "(not shown)"

Column 5, Line 60: Change "primarly" to --primary--

Column 7, Line 28: Change "proteuberances" to --protuberances--

Column 7, Line 58: After "one", delete "in"

Column 8, Line 17: Change "Certtain" to --Certain--

Column 10, Lines 1-2: Delete the second instance of "matter"

Column 10, Line 9: Change "freign" to --foreign--

Column 10, Line 22: Delete the second instance of "surfaces"

<u>In the Claims</u>

Column 10, Claim 1, Line 40: Change "enemy" to --energy--

Column 13, Claim 52, Line 54: Before "further", delete "wherein"

Signed and Sealed this

Twenty-ninth Day of August, 2006

JON W. DUDAS  
*Director of the United States Patent and Trademark Office*